United States Patent
Lewitschnig et al.

(10) Patent No.: US 12,493,077 B2
(45) Date of Patent: Dec. 9, 2025

(54) DETERMINING THE REMAINING USEFUL LIFE OF POWER MODULES

(71) Applicant: Infineon Technologies AG, Neubiberg (DE)

(72) Inventors: Horst Lewitschnig, Klagenfurt (AT); Giovanni Di Nuzzo, Munich (DE)

(73) Assignee: Infineon Technologies AG, Neubiberg (DE)

( * ) Notice: Subject to any disclaimer, the term of this patent is extended or adjusted under 35 U.S.C. 154(b) by 512 days.

(21) Appl. No.: 17/935,803

(22) Filed: Sep. 27, 2022

(65) Prior Publication Data
US 2024/0103090 A1  Mar. 28, 2024

(51) Int. Cl.
*G01R 31/392* (2019.01)
*G01R 31/367* (2019.01)
*G01R 31/3842* (2019.01)

(52) U.S. Cl.
CPC ......... *G01R 31/392* (2019.01); *G01R 31/367* (2019.01); *G01R 31/3842* (2019.01)

(58) Field of Classification Search
CPC . G01R 31/392; G01R 31/3842; G01R 31/367
See application file for complete search history.

(56) References Cited

U.S. PATENT DOCUMENTS

| | | | |
|---|---|---|---|
| 6,140,928 A * | 10/2000 | Shibuya | H01M 10/48 324/426 |
| 9,465,373 B2 | 10/2016 | Allen-Ware et al. | |
| 10,250,029 B2 | 4/2019 | Carletti et al. | |
| 10,699,041 B2 | 6/2020 | Hammerschmidt | |
| 2005/0154561 A1 * | 7/2005 | Legault | G06F 11/008 702/183 |
| 2005/0251718 A1 * | 11/2005 | Hong | G01R 31/318342 714/738 |
| 2006/0209607 A1 * | 9/2006 | Menczigar | H03K 19/00384 365/207 |
| 2010/0045361 A1 * | 2/2010 | Kanschat | H03K 17/06 327/383 |
| 2014/0068298 A1 | 3/2014 | Simeral | |
| 2014/0312873 A1 * | 10/2014 | Raja | H03K 17/145 323/311 |

FOREIGN PATENT DOCUMENTS

| | | | | |
|---|---|---|---|---|
| CN | 113759225 | * | 12/2021 | G01R 31/26 |
| JP | WO2022024847 | * | 2/2022 | B60L 3/0046 |

OTHER PUBLICATIONS

"Einfluss von Alterungseffekten auf die Robustheit digitaler Schaltungen", Retrieved from https://www.edacentrum.de/robust/de/content/zue/04_zue12-robust-tutorial-TUM.pdf, Retrieved on Sep. 15, 2021, 40 pp.

(Continued)

Primary Examiner — Lisa M Caputo
Assistant Examiner — Sharah Zaab
(74) Attorney, Agent, or Firm — Shumaker & Sieffert, P.A.

(57) ABSTRACT

A system may comprise a power module including a power switch, a driver circuit configured to control an ON state and an OFF state of the power switch, and a processor configured to control the driver circuit. The processor may be configured to receive a voltage associated with the power switch in the ON state and determine a state of health (SOH) for the power switch based on the voltage and a regression model associated with the power switch.

18 Claims, 9 Drawing Sheets

(56) References Cited

OTHER PUBLICATIONS

Automotive Electronics Council, "Failure Mechanism Based Stress Test Qualification for Integrated Circuits", Automotive Electronics Council, Sep. 11, 2014, 48 pp.

IEC, "Reliability data handbook—model for reliability prediction of electronics components, PCBs and equipment", International Electrotechnical Commission, First edition, Received on Sep. 15, 2021, 96 pp.

Jenkins et al., "On-chip circuit to monitor long-term NBTI and PBTI degradation," Microelectronics Reliability, Elsevier, accepted Jul. 10, 2013, 5 pp.

Ritter et al., "Aging sensors for on-chip metallization of integrated LDMOS transistors under cyclic thermo-mechanical stress," Microelectronics Reliability, Elsevier, accepted Jun. 6, 2017, 5 pp.

Ritter et al., "Resistance change in on-chip aluminum interconnects under cyclic thermo-mechanical stress," Microelectronics Reliability, Elsevier, Jun. 7, 2019, 5 pp.

U.S. Appl. No. 16/915,794, filed Jun. 29, 2021, naming inventors De Gasperi et al.

U.S. Appl. No. 17/457,166, filed Dec. 1, 2021, naming inventors Gstoettenbauer et al.

U.S. Appl. No. 17/457,183, filed Dec. 1, 2021, naming inventors Zettler et al.

U.S. Appl. No. 17/457,198, filed Dec. 1, 2021, naming inventors Rossmeier et al.

U.S. Appl. No. 17/457,207, filed Dec. 1, 2021, naming inventors Hammerschmidt et al.

U.S. Appl. No. 17/457,216, filed Dec. 1, 2021, naming inventors Kleeberger et al.

U.S. Appl. No. 17/457,221, filed Dec. 1, 2021, naming inventors Georgakos et al.

\* cited by examiner

DETERMINING THE REMAINING USEFUL LIFE OF POWER MODULES

TECHNICAL FIELD

This disclosure relates to power switches such as field effect transistors (FETs) and insulated gate bipolar transistors (IGBTs), and systems, driver circuits, and processors used to control power switches.

BACKGROUND

Power switches are used in a wide variety of applications in order to control power being delivered to a load. Field effect transistors (FETs), such as Metal-Oxide Field Effect Transistors (MOSFETs), junction-gate field effect transistors (JFETs), or other FETs are often used as power switches. FETs may be formed in silicon (Si), gallium nitride (GaN), silicon carbide (SiC), or another semiconductor material. Examples of MOSFETs may include, but are not limited to, PMOS, NMOS, DMOS, or any other type of MOSFET, or any combination of the same. Insulated gate bipolar transistors (IGBT) are another example device used as power switches.

Power switches are typically controlled by one or more driver circuits via a voltage or current signal applied to a control node of a power switch so as to control on/off switching of the power switch, e.g., a voltage applied to the gate of a FET or to the gate of an IGBT. A processor may provide control signals to the driver circuit(s) to provide system-level control over the power switches.

SUMMARY

This disclosure is directed to techniques for determining the remaining useful life of a power module that includes one or more power switches, and devices and systems that implement such techniques. In particular, according to this disclosure, a processor may apply a regression model based on one or more inputs associated with operation of the power module in order to determine the remaining useful life of the power module. In some examples, the inputs received by the processor during power module operation can define and/or adjust the regression model over time. In this way, the parameters of the regression model can be adapted over time to properly characterize the actual power module that is being used, and the prediction of the useful life of the power module can be improved relative to conventional techniques.

In one example, this disclosure describes a system that comprises a power module, a driver circuit, and a processor. The power module includes a power switch, and the driver circuit is configured to control an ON state and an OFF state of the power switch. The processor is configured to control the driver circuit, and according to this disclosure, the processor is configured to receive a voltage associated with the power switch in the ON state and determine a state of health (SOH) for the power switch based on the voltage and a regression model associated with the power switch.

In another example, this disclosure describes a processor associated with a power switch, wherein the processor is configured to control a driver circuit for the power switch and wherein the processor is configured to receive a voltage associated with a power switch in an ON state and determine a SOH for the power switch based on the voltage and a regression model associated with the power switch.

In another example, this disclosure is directed to method that comprises receiving a voltage associated with a power switch in an ON state and determine a SOH for the power switch based on the voltage and a regression model associated with the power switch.

Details of these and other examples are set forth in the accompanying drawings and the description below. Other features, objects, and advantages will be apparent from the description and drawings, and from the claims.

DETAILED DESCRIPTION

This disclosure is directed to techniques for determining the remaining useful life of a power module that includes one or more power switches, and devices and systems that implement such techniques. Power switches are used in a wide variety of applications in order to control power being delivered to a load. Field effect transistors (FETs), such as Metal-Oxide Field Effect Transistors (MOSFETs) and junction-gate field effect transistors (JFETs), and other types of FETs are often used as power switches. FETs, such as MOSFETs and JFETs, may be formed in silicon (Si), gallium nitride (GaN), silicon carbide (SiC), or another semiconductor material. Examples of MOSFETs may include, but are not limited to, PMOS, NMOS, DMOS, or any other type of MOSFET, or any combination of the same. Insulated gate bipolar transistors (IGBT) are another example device used as power switches, and these and other types of power switches that use other technologies can also benefit from the techniques of this disclosure.

Power switches are typically controlled by a driver circuit via pulse modulation (PM) signals, such as pulse width modulation (PWM), pulse frequency modulation (PFM), pulse duration modulation, pulse density modulation, or another type of modulation control signal. Modulation control signals can be applied to the gate (or other control terminal) of a power switch so as to control on/off switching of the power switch, and thereby control the average amount of power delivered through the power switch to a load. The on/off switching of the power switch effectively chops its power delivery up into discrete pulses. The average value of voltage and/or current fed to a load can be controlled by turning the switch on and off at a fast rate. The longer the switch is on compared to the off periods, the higher the total power supplied to the load.

In many applications, two different power switches are configured in a high-side and low-side configuration, and the on/off switching of the two power switches is synchronized, in order to deliver the desired power to a switch node positioned between the high-side and low-side switch. Also, for multi-phase electric motors, three phases of high-side and low-side switches may be used. Separate and discrete power modules may be used for multi-phase motor control, or alternatively, a three-phase power module with six different power switches in the same module may be used.

A processor, such as a microprocessor, or other clock-based processing circuit may provide control signals to the driver circuits in order to control operation of the power switches. Moreover, in many situations, driver circuits may include a galvanic isolation barrier that galvanically isolates a low-voltage domain associated with the processor from a high-voltage domain associated with the power switch.

According to this disclosure, the processor may be configured to apply a regression model based on one or more inputs associated with operation of the power module in order to determine the remaining useful life of the power module. In some examples, the parameters of the regression modal can be adapted over time to properly characterize the actual power module that is being used, and in this way, the prediction of the useful life of the power module can be improved relative to conventional techniques. In this disclosure, the regression model may refer to a linear regression model, a non-linear regression model, or another type of regression model.

Figure 1:
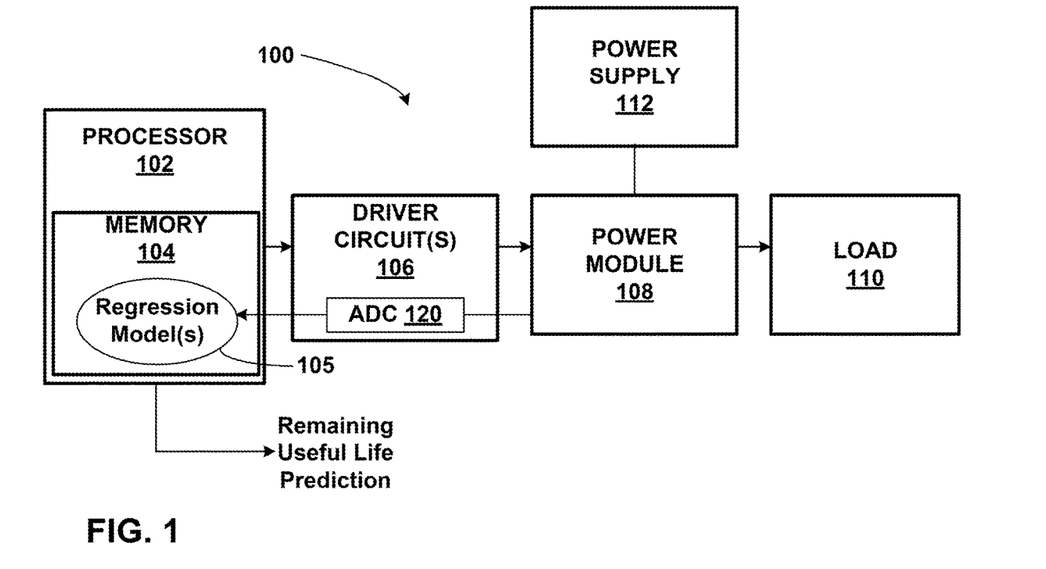
FIG. 1 is a block diagram of a system that may be used to control a power module consistent with this disclosure.

FIG. 1 is a block diagram of a system 100 that may be used to control a power module 108 consistent with this disclosure. In particular, system 100 may comprise a power module 108 that includes one or more power switches, and one or more driver circuits 106 configured to control and ON state and an OFF state of one or more power switches within power module 108. This ON/OFF control of one or more power switches within power module 108 can deliver power to load 110 based on stored power within a power supply 112. In this way, power module 108 controls the delivery of power to load 110 based on on/off switching of the power switch(es) within power module 108, which effectively chops the power delivery up into discrete pluses. The average value of voltage and/or current fed to load 110 can be controlled by turning the power switch(es) in power module 108 on and off at a desired duty cycle.

A processor 102 include processing circuitry that is configured to control driver circuit 106 to define the PM signals applied to power module 108. Processor 102 may include circuitry configured to receive a voltage associated with a power switch in power module 108 when the power switch in the ON state. Moreover, processor 102 may include circuitry configured to determine a state of health (SOH) for the power switch in power module 108 based on the voltage and one or more regression models 105 associated with the power switch. In this way, processor 102 can predict a remaining useful life (RUL) associated with power module 108. As described in greater detail below, in some cases, this process is applied at a start-up associated with the power switch within power module 108. If used in a vehicle, for example, the process may apply when the vehicle is started.

Start-up may refer to a so-called "cold start," for example, which may define a point in time when temperature associated with power module 108 is more likely to match ambient conditions, and therefore, performing the process at start-up (e.g., a cold start) can help to negate or minimize effects of temperature on the process. If actual junction temperature of the power switch is available, then the techniques described herein may be applied at every start-up, including cold starts and other starts where the automobile or circuit is hotter than ambient conditions. Cold starts, however, may be especially useful time for voltage measurements where the actual junction temperature is not available, and instead, temperature of the power switch is represented by an NTC measurement near the power switch. Indeed, as explained below, in some cases, NTC temperature measurements can be very useful at a cold start, and in some examples, in addition to temperature measurements, timing measurements may be used to record operating time (e.g., $t_{operation}$) and possibly the timing (time stamps) associated with temperature measurements.

Memory 104 is associated with processor 102 and can be used to store the one or more regression models 105 that are applied in the process. Memory 104 may be internal to processor 102 or memory 104 may comprise an external memory that is coupled to processor 102 via a data bus or direct connection. In these or other arrangements, memory 104 can be associated with processor 102 for storing regression model(s) 105.

Figure 2:
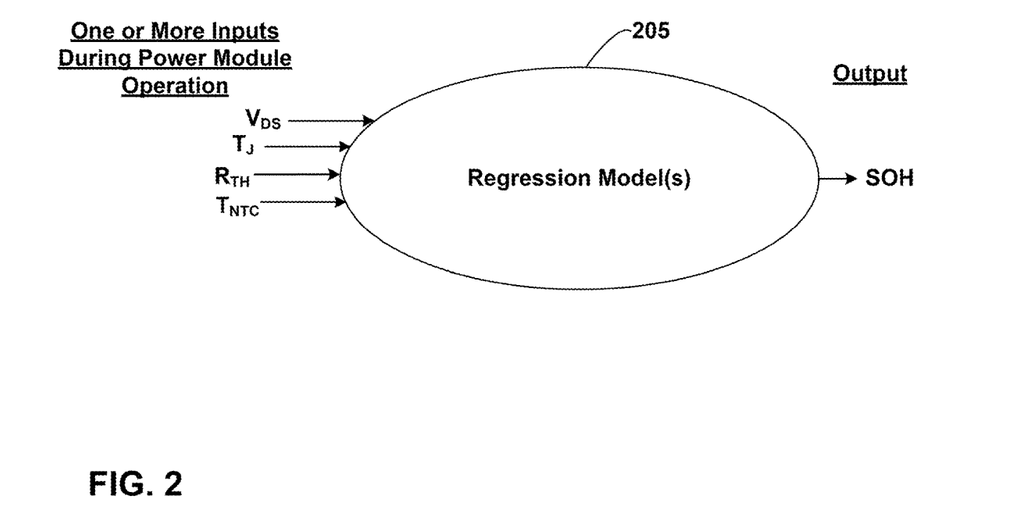
FIG. 2 is a conceptual depiction of a data structure that may be stored in a memory associated with a processor consistent with this disclosure.

FIG. 2 is a conceptual depiction of a data structure that defines a regression model 205 that may be stored in a memory associated with a processor consistent with this disclosure. Regression model 205 may correspond to regression model 105 of FIG. 1 in some examples.

As shown in FIG. 2, regression model 205 may receive one or more inputs during operation of a power module, and based on those inputs, regression model can generate an output in the form an SOH metric or other indicator of the SOH of the power module. In some cases, simulations may be applied to pre-define regression model 205 prior to operation of the power switch in the field, such as based on operational data associated with power modules during the device qualification process. Simulations and device qualifications may be useful to help define the regression model more quickly for an individual device or for a class of devices. In some examples, a regression model can be derived during device qualification (e.g., as part of the manufacturing steps), and then the derived regression model can be applied with operational data when the device is used. In some cases, field data associated with a class of devices may also be used in defining or refining the regression model for that class of devices.

In some examples, the one or more inputs to regression model 205 comprises a voltage over the power switch, which can be measured and sent from power module 108 to processor 102, such as via an analog to digital converter (e.g., ADC 120 of driver circuit 106) applied to a voltage measurement. If the power module includes a FET, for example, the voltage over the power switch may comprise the drain-to-source voltage of the FET, which is shown in FIG. 2 as $V_{DS}$. Other potential inputs to regression model 205, may include such things as the juncture temperature of the power switch (shown as Ti), a thermal resistance of the power switch (shown as $R_{TH}$) or a temperature measurement from a negative temperature coefficient thermistor (shown as $T_{NTC}$). Although these or other inputs to the regression model may be used, this disclosure will primarily focus on an example wherein the input to the regression model is the measured voltage over the power switch, e.g., $V_{DS}$.

Regression model 105, 205 comprises a data structure for modelling the relationship between a scalar response (e.g., SOH) and one or more explanatory variables (e.g., the inputs to the regression model that are measured in the power switch). In regression, the relationships are modeled using a predictor whose unknown model parameters are estimated from the actual data. A predictive model can be fitted via regression to an observed data set. Again, in some examples, simulations and device qualifications may be pre-applied to help define regression model 105, 205, although actual use of the device can also be used to further develop or adjust regression model 105, 205. In any case, the device may be configured to adapt regression parameter during use of power module 108. In some cases, in order to define the initial state of the regression model, processor 102 may be configured to apply data collection for an initial period of initial device operation in order to calculate the parameters of the regression model, and then during further device operation, the regression parameters can be re-calculated based on the measured data.

Regression models are often fitted using a so-called least squares approach, but regression models may also be fitted in other ways, such as by minimizing the "lack of fit" in some other norm, or by minimizing a penalized version of the least squares cost function.

Referring again to FIG. 1, in some examples, processor 102 may be configured to receive the voltage associated with the power switch of power module 108 at a cold start associated with the power switch and determine a SOH metric based on the voltage associated with the power switch at the cold start. If used in a vehicle, for example, the process may apply when the vehicle is started after a sufficient period of being off, e.g., at a so-called "cold start." A cold start associated with vehicle or device start-up, in any case, may define a point in time when temperature associated with power module 108 is more likely to match ambient conditions, and therefore, performing the process at start-up can help to negate or minimize effects of temperature on the process. If actual junction temperature of a power switch is available, then the techniques of this disclosure may be applied at every start-up, and not just at cold starts. Cold starts, however, define a useful point in time when temperature measurements by NTC sensors may be useful to approximate junction temperature of a power switch.

Figure 3A:
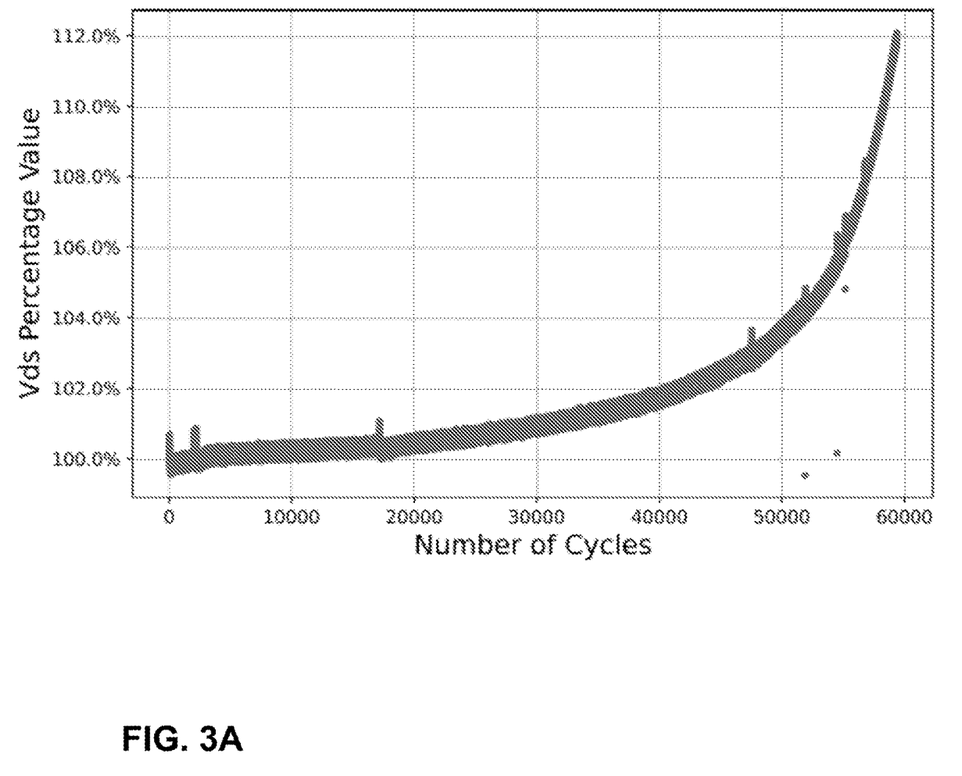
FIG. 3A is a graph showing a typical power module degradation consistent with this disclosure.

FIG. 3A is a graph showing typical power module degradation consistent with this disclosure. In some examples, processor 102 may be configured to determine an SOH metric based on the voltage over the power switch and the regression model, and processor 102 may be further configured to issue a maintenance alert in response to the SOH metric reaching a RUL threshold. As shown in FIG. 3A, for example, the $V_{DS}$ increases as a percentage of its initial value over time, which shows wear or degradation in the power switch. By setting a maximum $V_{DS}$ percentage value, e.g., 106 percent or 107 percent, processor 102 can determine (based on measured $V_{DS}$) when power module 108 has reached the end of its useful life, prior to device malfunction. In this case, it may also be useful or necessary to record operating time and operating temperature associated with the $V_{DS}$ percentage values. Also, in some examples, processor 102 could also apply acceleration factors to calculate operating time at a reference temperature.

Moreover, in some examples, to determine the SOH, processor 102 may be configured to identify a wire break event based on the voltage and the regression model, wherein processor 102 is configured to issue a maintenance alert in response to identifying the wire break event. For example, some power modules include multiple source wires configured to deliver the current through the power module. In such cases, voltage measurements in combination with a developed regression model may be able to identify wire breaks, which can cause accelerated degradation of the power module.

Figure 3B:
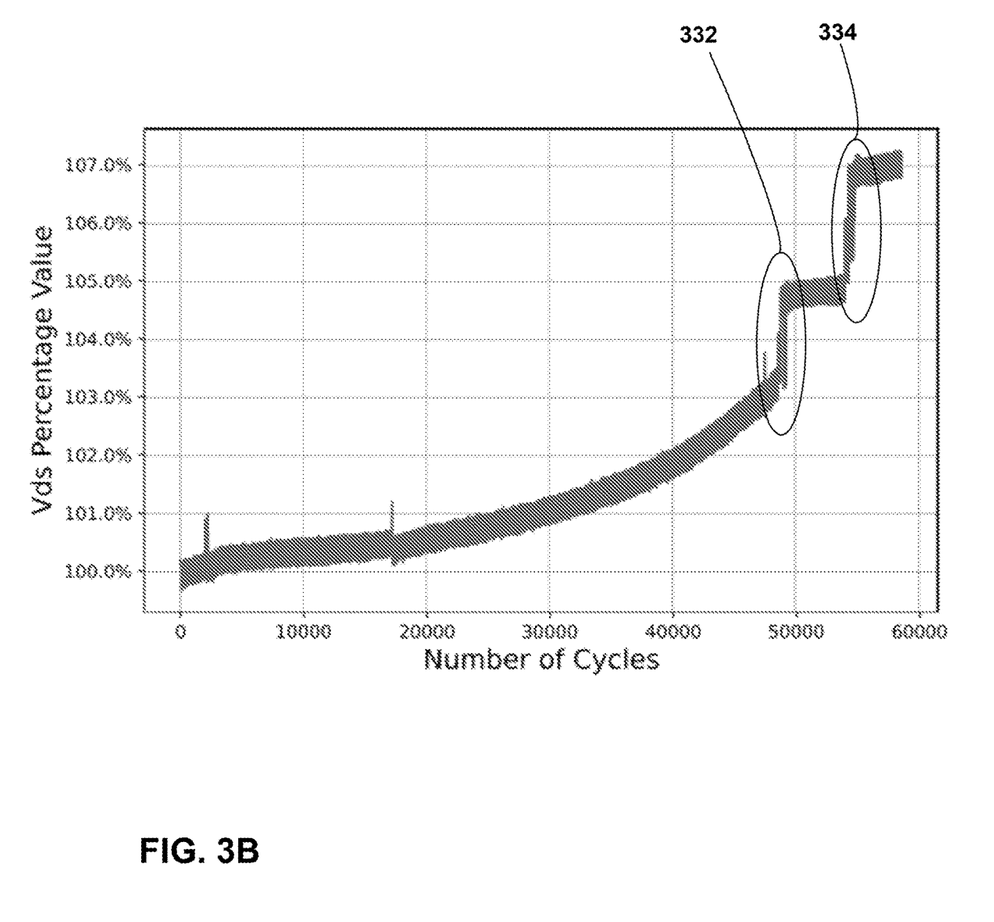
FIG. 3B is another graph showing another type of power module degradation consistent with this disclosure.

FIG. 3B is another graph showing another type of power module degradation consistent with this disclosure. As shown at locations 332 and 334, a quick spike in the $V_{DS}$ measurements, followed by leveling of the $V_{DS}$ measurements may be an indicator of a wire break event that can be identified based on measured $V_{DS}$ and the application of a regression model.

In some examples, processor 102 may be configured to receive the voltage associated with the power switch of power module 108 in the ON state at each cold start associated with power module 108, calculate regression parameters for the regression model based on the received voltage at each cold start, and determine the SOH for the power switch at each cold start. Again, cold start is an especially effective time for making voltage measurements to characterize a power switch since power-up is a point of time where ambient temperature is more likely to match the temperature of a power switch associated with power module 108. Of course, more complicated regression could also be performed using additional measurements such as $T_J$, $R_{TH}$, or $T_{NTC}$ associated with the power switch.

As an example, the regression model may be defined according to an Equation 1:

$$V = b_0 + b_1(t)^x$$

where V represents the voltage over the power switch, $b_0$ and $b_1$ are the regression parameters, X is constant, and t is a value of operating time. With Equation 1, one can calculate the remaining useful life of the power switch indicative of the SOH. Many other forms of regression equations could be used.

In some examples, processor 102 may be configured to store voltage values associated with the power switch in a memory 104 associated with processor 102 at each cold start of power module 108 and calculate regression parameters for regression model 105 based at least in part on the stored voltage values.

Also, processor 102 may be configured to define one or more other independent parameters, such as time and/or temperature. In this case, processor 102 may be configured to calculate the regression parameters ($b_0$, $b_1$) for independent variables (t) based on measured parameters ($V_{DS}$), based on a model (see equation 1 above). Of course, other regression models could be used, other independent variables can be used, and other measured parameters could be used. In some examples, processor 102 may be configured to use operation time and temperature measurements to compute a third variable, which may be referred to as a thermal stress time. The thermal stress time provides a metric indicative of accumulated thermal stress on the device, which could provide a predictive indicator of remaining thermal stress hours that the device is able to handle.

In some examples, processor 102 may be configured to calibrate measured voltages based on measured temperatures to improve the calculation of the model parameters. For example, processor 102 may be configured to receive temperature values associated with the power switch of power module 108 at each cold start of the power module 108, receive voltage values associated with the power switch power module 108 at each cold start power module 108, calibrate each of the voltage values associated with the power switch at each cold start based on the received temperature values associated with the power switch at each cold start of power module 108, store calibrated voltage values associated with the power switch in memory 104 associated with processor 102 for each cold start power module 108, and calculate regression parameters for the regression model based at least in part on the calibrated voltage values. In some such examples, the temperature values correspond a junction temperature Ti of the power switch measured by a temperature sensor integrated in power module 108, and in other such examples, the temperature values may correspond an ambient temperature of the power switch measured by an external temperature sensor $T_{NTC}$ that is located on or within a circuit package associated with power module 108. Also, processor 102 or driver circuit 106 could use some type of timing or timer to help determine or identify a cold start for regression measurements of voltage or other variables, in which case processor 102 may not receive temperature measurements, but instead, processor 102 can wait a sufficient time since last turn off or last use of the power module 108 before performing regression calculations.

In some additional examples, processor 102 may be configured to store voltage values associated with the power switch in a memory associated with the processor at each cold start the power module, store thermal resistance values associated with the power switch in the memory associated with the processor at each cold start the power module, and calculate regression parameters for the regression model based at least in part on stored voltage values and the stored thermal resistance values associated with the power switch.

As noted, in some cases, the power switch or switches within power module 108 may comprise one or more FETs and the voltage associated with the power switch comprises a drain-to-source voltage associated with the FET in the ON state. Alternatively, in some cases, the power switch or switches within power module 108 may comprise one or more IGBTs and the voltage associated with a power switch comprises a collector-to-emitter voltage associated with the IGBT in the ON state.

Driver circuit 106 may include an analog-to-digital converter 120 configured to determine the voltage associated with the power switch and provide this measured voltage to processor 102 in a digital format. In this way, a voltage measurement of $V_{DS}$ (or other analog measurements) can be made and delivered to processor 102 in a digital format that can be used by processor 102 for regression analysis.

Figure 4:
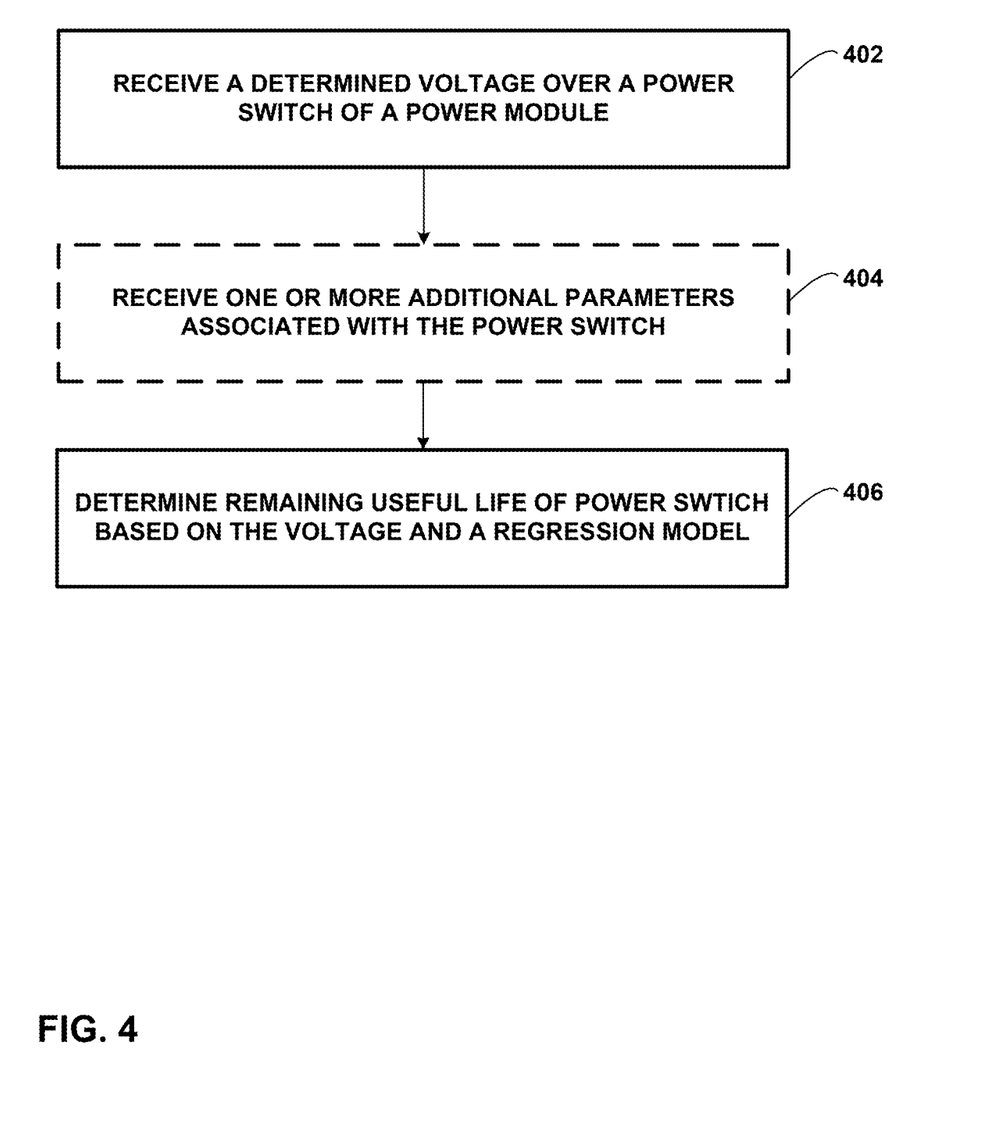
FIGS. 4 and 5 are flow diagrams consistent with one or more examples of this disclosure.
Figure 5:
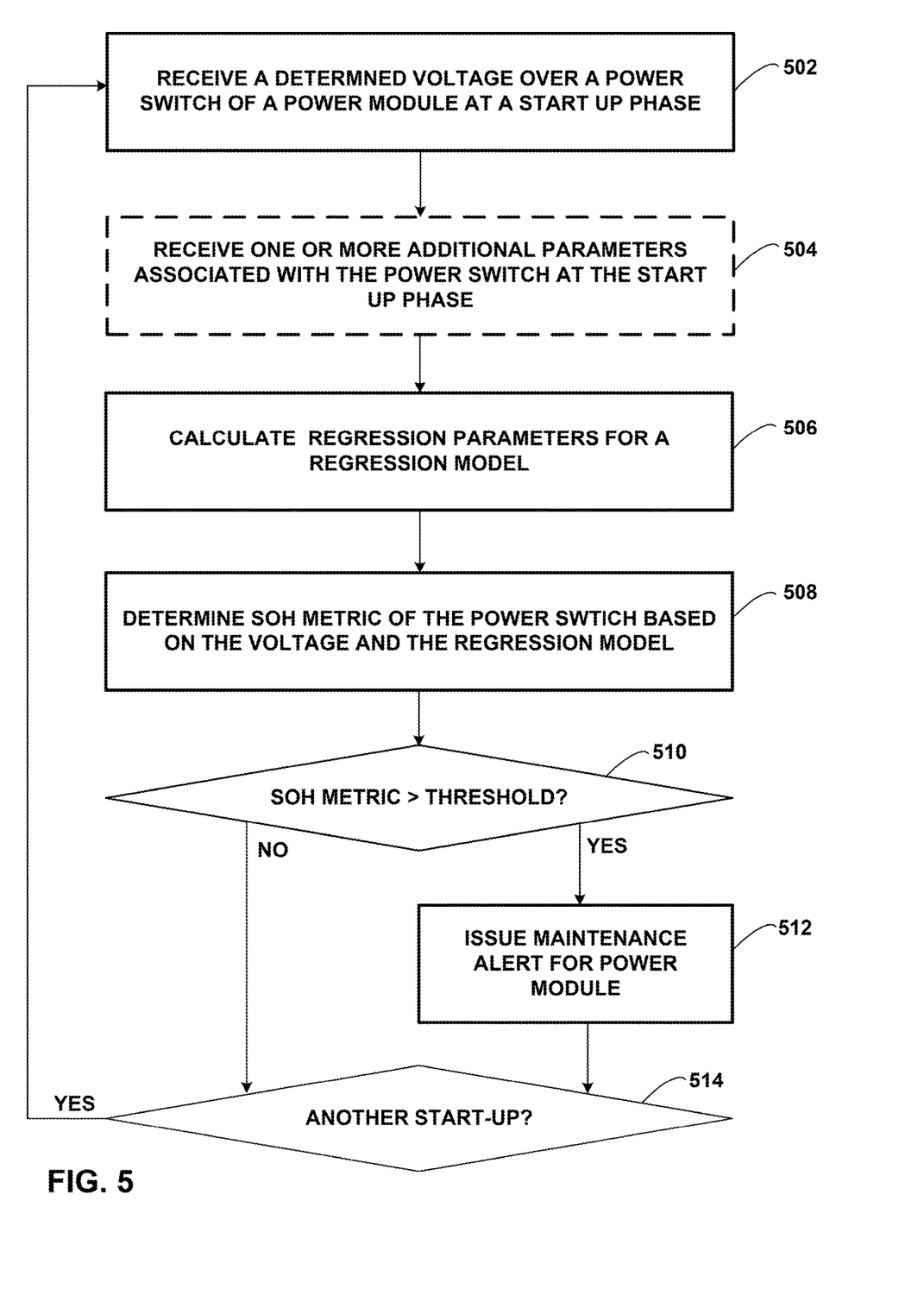

FIGS. 4 and 5 are flow diagrams consistent with one or more examples of this disclosure, which may be performed by system 100 or by processor 102 of system 100. As shown in FIG. 4, processor 102 receives a determined voltage over a power switch of power module 108, such as from ADC 120 of driver circuit(s) 106 (402). Optionally, processor 102 may also receive one or more additional parameters, such as $T_J$, $R_{TH}$, $t_{operation}$, or $T_{NTC}$ associated with a power switch of power module 108 (404). Based on the determined voltage and a regression model (and possibly based on optional additional parameters), processor 102 determines an RUL of power module 108 (406). In this way, processor 102 is configured to assess the SOH of power module 108.

In the example shown in FIG. 5, processor 102 receives a determined voltage over a power switch of power module 108, such as from ADC 120 of driver circuit(s) 106 (502). Optionally, processor 102 may also receive one or more additional parameters, such as $T_J$, $R_{TH}$, $t_{operation}$, or $T_{NTC}$ associated with a power switch of power module 108 (504). Based on the determined voltage (and possibly based on optional additional parameters and/or previously stored regression model data), processor 102 calculates regression parameters for a regression model (506) and determines a SOH metric of the power switch based on the voltage and the regression model (508). If the SOH metric exceeds a threshold (yes branch of 510), processor 102 may issue a maintenance alert for the power module (512). Moreover, for some systems, processor 102 may further disable the power switch or limit operation of the power switch (not shown in FIG. 5) in response to the SOH metric reaching the threshold. The process of FIG. 5 repeats itself at every start-up (514), e.g., every cold start associated with the power module. In some cases, an $R_{TH}$ value can be computed by processor 102 based on the on-state voltage, junction temperature, case temperature, and load current.

Techniques of this disclosure may include measurement of health indicators before the key-on, when the device is cold. In some examples, measurement of $V_{DS}$ and $T_j$ may occur for every switch-on of the car or for every cold start. In some cases, the system may set or define a minimum time between one switch-off and the next switch-on to cool down enough the device to define another cold start.

Monitoring of health indicators of a power module may occur over the lifetime of the power module. The system may compensate for the influence of the ambient temperatures ($T_{amb}$). Possible usage of the NTC sensor to monitor the $T_{amb}$ could provide such measurements via an already present sensor in the power module.

Product features at a system level may include features such as:
  ADC for $V_{DS}$ measurement (which could be discrete or integrated in gate drivers)
  Optional: On-chip $T_j$ sensor
  Recording of temperature and usage time
  Computational resources in the microcontroller for RUL prediction SOH prediction may include features that may include:
  Usage of monitored parameters to infer the SOH of the device. Predictive model built from regression model that is defined with test data related to a specific power module, where a random sample of same devices are thermally stressed. Possible additional routine step during qualification: building up of curves which relate the SOH to $V_{DS}$ and $T_j$ from the test data. Moreover, in some examples, the regression model can also be derived from simulations.
  The regression coefficients $b_0$, $b_1$, . . . may be specific for the product under test, but may not always be used for any kind of power module. In this case, regression equations may be product related for specific products. One advantage of using regression: lower computational power required relative to other techniques.
  Methods of defining the accumulated stress time from field operation related to each measurement of $V_{DS}/T_J$. Such methods may define how to count accumulated hours of thermal stress during the lifetime, and the possible usage of NTC sensor to measure temperature and estimate accumulated thermal stress between two subsequent measurements.

Figure 6:
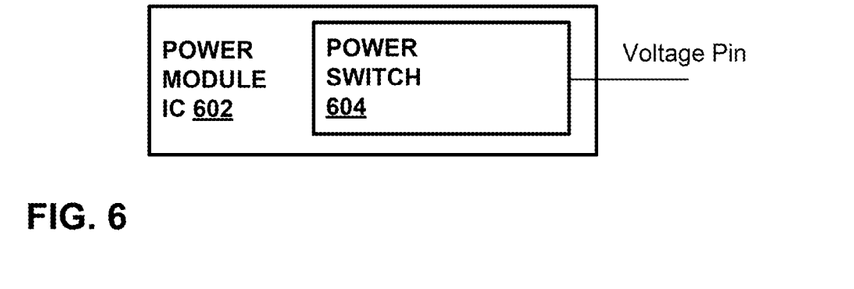
FIG. 6 is a block diagram of a basic power module, which may be used within a system of one or more examples of this disclosure.

FIG. 6 is a block diagram of a basic power module 62, which may correspond to power module 108 of FIG. 1. Power modules may refer to discrete devices with one power switch, or integrated devices that include multiple power switches. In the example of FIG. 6, power module 62 includes one power switch 64 for delivering power to a load.

A voltage pin from power switch 64 may define a $V_{DS}$ voltage that can be measured by driver circuit(s) 106. ADC 120 of driver circuit(s) 106, in turn, can send digital values indicative of $V_{DS}$ to processor 102 for the regression analysis and techniques described herein.

Figure 7:
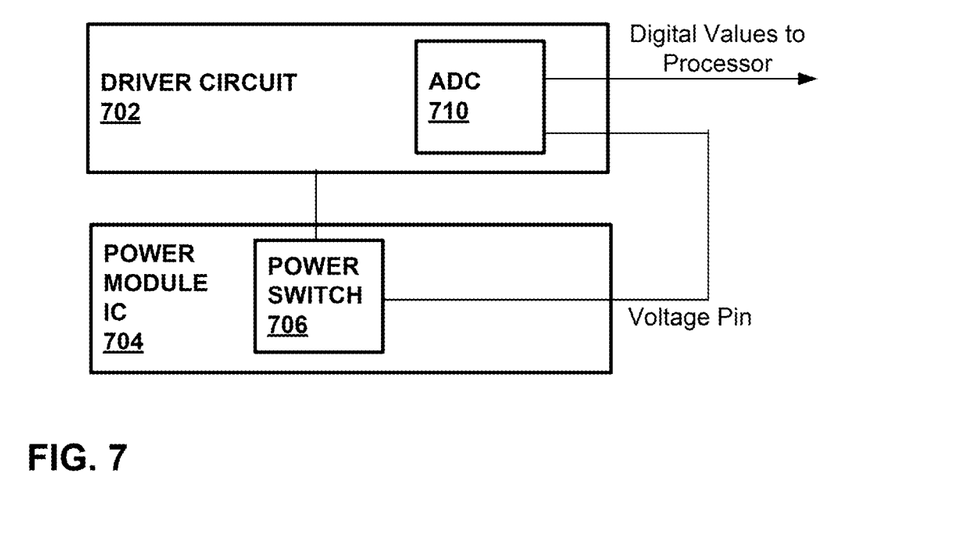
FIG. 7 is a block diagram showing a driver circuit and a power module, which may be used within a system of one or more examples of this disclosure.

FIG. 7 is a block diagram showing a driver circuit 702 and a power module 704, which may be used within a system of one or more examples of this disclosure. In some examples, driver circuit 702 and power module 704 of FIG. 7 may respectively correspond to driver circuit(s) 106 and power module 108 of FIG. 1. A voltage pin from power switch 706 may define a $V_{DS}$ voltage that can be measured by a driver circuit 702 via ADC 710. ADC 710, in turn, can send digital values indicative of $V_{DS}$ to a processor for the regression analysis and techniques described herein.

Figure 8:
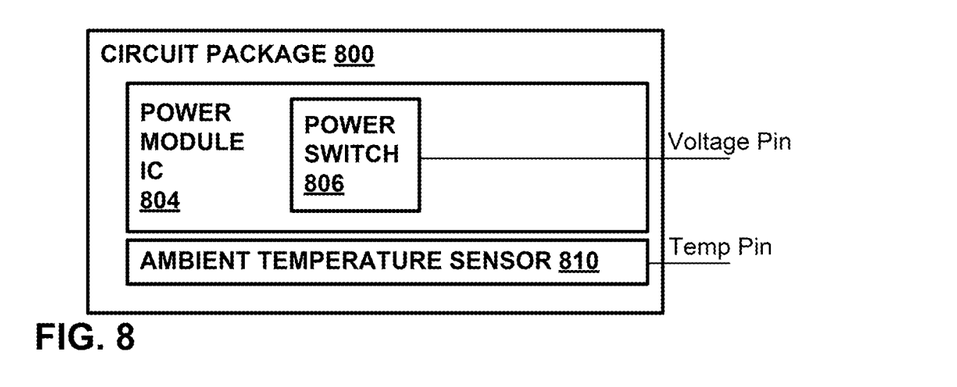
FIG. 8 is a block diagram showing a circuit package, which may be used within a system of one or more examples of this disclosure.

FIG. 8 is another example block diagram showing a circuit package 800 that includes a power module 804 and an ambient temperature sensor 810 within circuit package. Ambient temperature sensor 810, for example, may comprise a negative temperature coefficient thermistor housed inside circuit package 800 to provide temperature measurements indicative of power switch 806 during operation. A voltage pin from power switch 806 may define a $V_{DS}$ voltage that can be measured by a driver circuit 106, and similarly, a temperature pin from ambient temperature sensor 810 may define a $T_{NTC}$ value that can also be measured by driver circuit(s) 106. ADC 120 of driver circuit(s) 106, in turn, can send digital values indicative of $V_{DS}$ and $T_{NTC}$ to processor 102 for the regression analysis and techniques described herein using both $V_{DS}$ and $T_{NTC}$. Ambient temperature sensor 810 may provide temperature measurements at cold starts, which may correlate well with the junction temperature of power switch 806.

Figure 9:
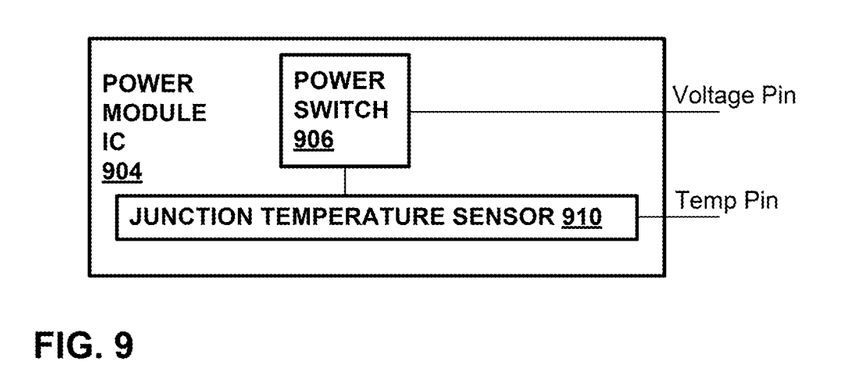
FIGS. 9-11 are block diagrams showing some exemplary power modules, which may be used within a system of one or more examples of this disclosure.

FIG. 9 is another example block diagram showing a power module 904 that includes both a power switch 906 and a junction temperature sensor 910 formed in the same semiconductor material of power module 904. Junction temperature sensor 910, for example, may be configured to measure the actual junction temperature Ti of power switch 906. A voltage pin from power switch 906 may define a $V_{DS}$ voltage that can be measured by a driver circuit 106, and similarly, a temperature pin from junction temperature sensor 910 may define a Ti value that can also be measured by driver circuit(s) 106. ADC 120 of driver circuit(s) 106, in turn, can send digital values indicative of $V_{DS}$ and Ti to processor 102 for the regression analysis and techniques described herein using both $V_{DS}$ and Ti.

Figure 10:
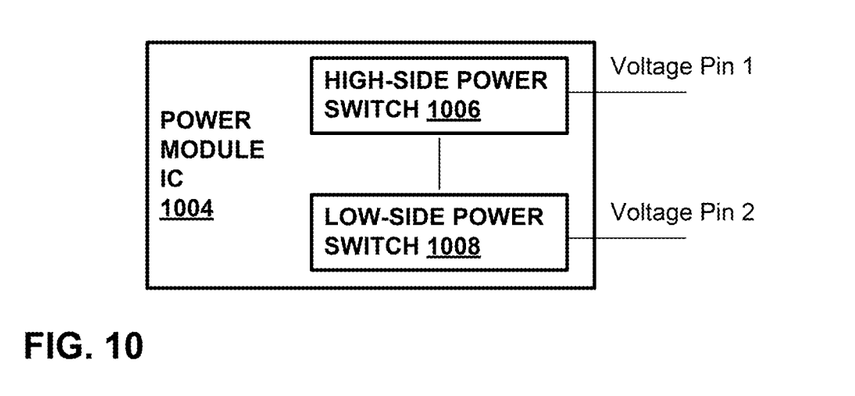

FIG. 10 is another example block diagram showing a power module 1004 that includes two power switches, e.g., a high-side power switch 1006 and a low-side power switch 1008 formed in the same semiconductor material of power module 1004. A first voltage pin from high-side power switch 1006 may define a $V_{DS}$ voltage for high-side power switch 1006 that can be measured by a driver circuit 106, and similarly, a second voltage pin from low-side power switch 1008 may define a $V_{DS}$ voltage for low-side power switch 1008 that can be measured by a driver circuit 106. ADC 120 of driver circuit(s) 106, in turn, can send digital values indicative of $V_{DS}$ to processor 102 for the regression analysis and techniques described herein using both $V_{DS}$ of high-side power switch 1006 and $V_{DS}$ of low-side power switch 1008. In particular, consistent with FIG. 10, processor 102 may perform regression analysis for both high-side power switch 1006 and low-side power switch 1008, and if either high-side power switch 1006 or low-side power switch 1008 is approaching the end of its RUL, then processor 102 may issue a maintenance alert for the power module 1004 (or possibly disable power module 1004). In this case, processor 102 may be configured to determine a SOH metric for power module based on a first SOH metric for the high-side power switch and a second SOH metric for the low-side power switch.

In some examples, a power module SOH (SOH_pm) may be computed from m power switches SOHs as follows:

$$SOH\_pm = \max(SOH_{switch-1}, SOH_{switch-2}, \ldots, SOH_{switch-m})$$

Or more in generally:

$$SOH\_pm = f(SOH_{switch-1}, SOH_{switch-2}, \ldots, SOH_{switch-m})$$

where f is a function to compute the power module SOH and SOH is a value between 0 (fresh device) and 1 (end of life). This could be expressed also by considering the Remaining Useful Life (RUL) as follows:

$$RUL\_pm = \min(RUL_{switch-1}, RUL_{switch-2}, \ldots, RUL_{switch-m})$$

Figure 11:
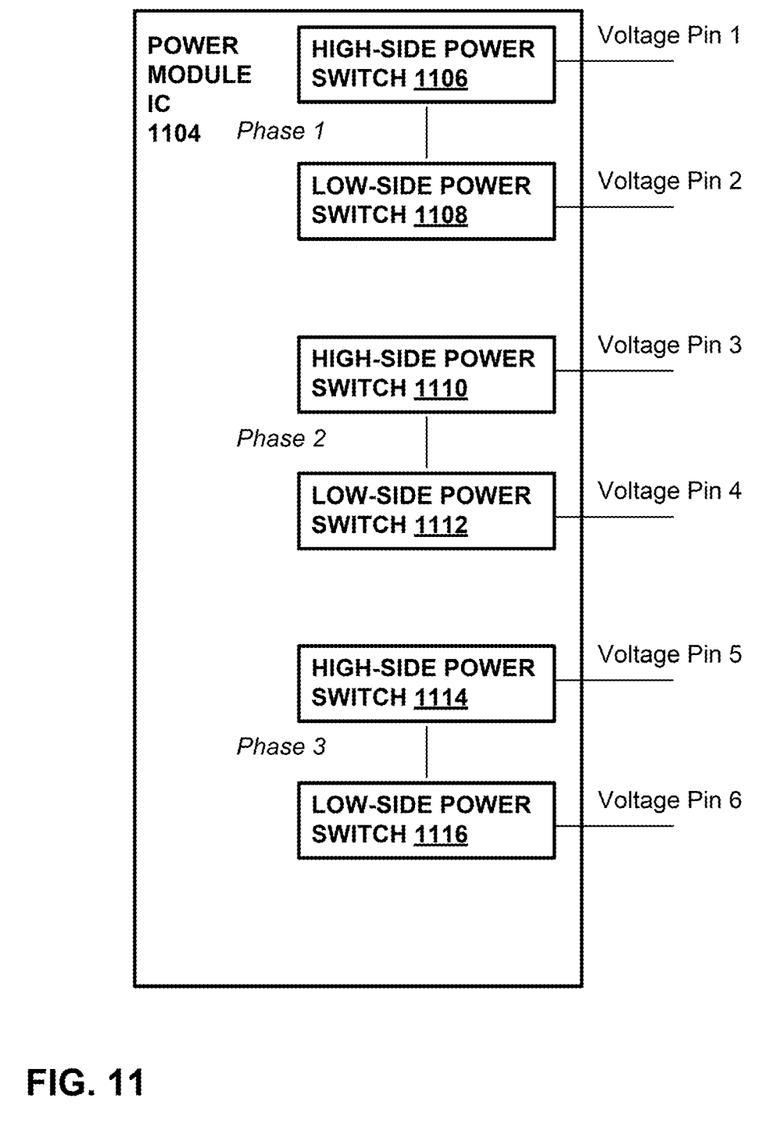

FIG. 11 is another example block diagram showing a power module 1104 that includes six power switches arranged in three pairs of high-side and low-side switches. For example, power module 1104 includes a high-side power switch 1106 and a low-side power switch 1108 for controlling phase 1 of an electric motor. In addition, power module 1104 includes a high-side power switch 1110 and a low-side power switch 1112 for controlling phase 2 of an electric motor, and power module 1104 further includes a high-side power switch 1114 and a low-side power switch 1116 for controlling phase 3 of an electric motor. In this example, each of the six power switches 1106, 1108, 1110, 1112, 1114, 1116 may be formed in the same semiconductor material of power module 1104. Thus, consistent with FIG. 11, power module 1104 includes six power switches arranged in three pairs of high-side and low-side switches, wherein power module 1104 is configured to control a three-phase electric motor. Moreover, in this case, processor 102 may be configured to determine a SOH metric for power module OC 1104 based on six different SOH metrics for the six power switches. Consistent with the example of FIG. 11, if any of the six different SOH metrics for the six power switches exceed a threshold, processor 102 may issue a maintenance alert for the power module 1104, disable the power module 1104, or limit operation of the power switches 1106, 1108, 1110, 1112, 1114, 1116.

Figure 12:
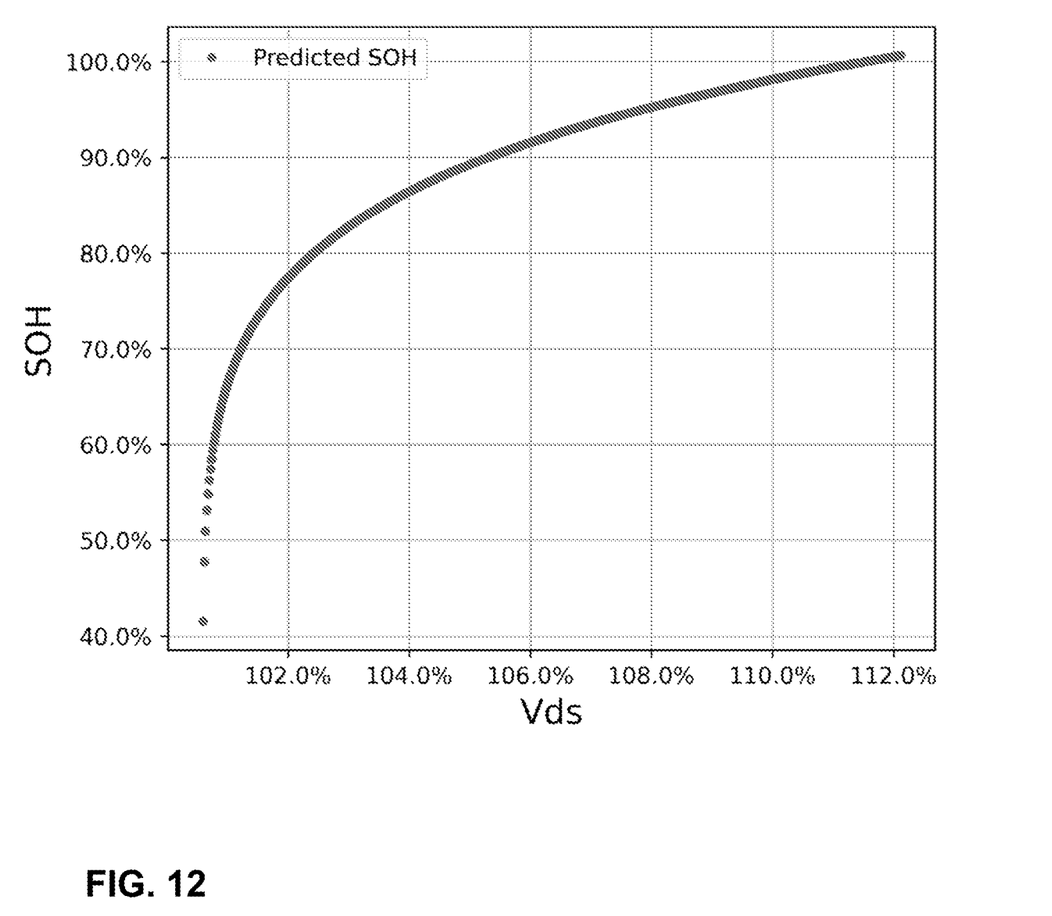
FIG. 12 is an example graph showing an example of SOH prediction using a voltage measurement and regression model.

FIG. 12 is an example graph showing an example of SOH prediction for one power switch using a voltage measurement and regression model. Measurements of $V_{DS}$ are used as input to the Predictive Model. 0% value of SOH corresponds to the fresh device, while 100% value of SOH occurs when the device reaches the End of Life. The system may implement one or more of the following features or RUL prediction:

Measurement of $V_{DS,on}$. Usage of $V_{DS,on}$ as input for the Predictive Model.

Predictive Model outputs the SOH and thus the RUL.

If the accumulated stress time is known, possible computation of the RUL in time format.

For example, if $V_{DS,on}$ increase ~6% (~150 mV increase in SiC HP Drive), SOH ~91%, so RUL is 9% of the Lifetime. If accumulated stress hours ~14600 (4 hours/day for 10 years) when the measurement is performed, it is possible to determine the RUL in hours as:

$$RUL = (14600*9)/91 \sim 1444 \text{ hours.}$$

The following clauses may illustrate one or more aspects of the disclosure.

Clause 1—A system comprising: a power module including a power switch; a driver circuit configured to control an ON state and an OFF state of the power switch; and a processor configured to control the driver circuit, wherein the processor is configured to receive a voltage associated with the power switch in the ON state and determine a SOH for the power switch based on the voltage and a regression model associated with the power switch.

Clause 2—The system of clause 1, wherein the processor is configured to receive the voltage associated with the power switch at a cold start associated with the power switch and determine a SOH metric based on the voltage associated with the power switch at the cold start.

Clause 3—The system of clause 1 or 2, wherein determining the SOH for the power switch comprises determining a SOH metric, and wherein the processor is configured to issue a maintenance alert in response to the SOH metric reaching a RUL threshold.

Clause 4—The system of any of clauses 1-3, wherein to determine the SOH, the processor is configured to identify a wire break event based on the voltage and the regression model, wherein the processor is configured to issue a maintenance alert in response to identifying the wire break event.

Clause 5—The system of any of clauses 1-4, wherein the processor is configured to: receive the voltage associated with the power switch in the ON state at each cold start associated with the power module; calculate regression parameters for the regression model based on the received voltage at each cold start; and determine the SOH for the power switch at each cold start.

Clause 6—The system of any of clauses 1-5, wherein the processor is configured to: store voltage values associated with the power switch in a memory associated with the processor at each cold start the power module; and calculate regression parameters for the regression model based at least in part on the stored voltage values.

Clause 7—The system of system of any of clauses 1-6, wherein the processor is configured to: receive temperature values associated with the power switch at each cold start of the power module; receive voltage values associated with the power switch at each cold start the power module; calibrate each of the voltage values associated with the power switch at each cold start based on the received temperature values associated with the power switch at each cold start of the power switch; store calibrated voltage values associated with the power switch in a memory associated with the processor for each cold start the power module; and calculate regression parameters for the regression model based at least in part on the calibrated voltage values.

Clause 8—The system of clause 7, wherein the temperature values correspond to a junction temperature of the power switch measured by a temperature sensor integrated in the power module.

Clause 9—The system of clause 7, wherein the temperature values correspond to an ambient temperature of the power switch measured by an external temperature sensor that is located on or within a circuit package associated with the power module.

Clause 10—The system of any of clauses 1-9, wherein the processor is configured to: store voltage values associated with the power switch in a memory associated with the processor at each cold start of the power module; store thermal resistance values associated with the power switch in the memory associated with the processor at each cold start of the power module; and calculate regression parameters for the regression model based at least in part on the stored voltage values and the stored thermal resistance values associated with the power switch.

Clause 11—The system of any of clauses 1-10, wherein the power switch comprises a FET and the voltage associated with a power switch comprises a drain-to-source voltage associated with the FET in the ON state.

Clause 12—The system of any of clauses 1-10, wherein the power switch comprises an IGBT and the voltage associated with a power switch comprises a collector-to-emitter voltage associated with the IGBT in the ON state.

Clause 13—The system of any of clauses 1-12, wherein the driver circuit includes an analog-to-digital converter configured to determine the voltage associated with the power switch.

Clause 14—The system of any of clause 1-13, wherein the power module includes a high-side power switch and a low side power switch, wherein the processor is configured to determine a SOH metric for the power module based on a first SOH metric for the high-side power switch and a second SOH metric for the low-side power switch.

Clause 15—The system of any of clause 1-13, wherein the power module includes six power switches arranged in three pairs of high-side and low-side switches, wherein the power module is configured to control a three-phase electric motor, and wherein the processor is configured to determine a SOH metric for the power module based on six different SOH metrics for the six power switches.

Clause 16—A processor associated with a power switch, wherein the processor is configured to control a driver circuit for the power switch and wherein the processor is configured to: receive a voltage associated with a power switch in an ON state and determine a SOH for the power switch based on the voltage and a regression model associated with the power switch.

Clause 17—The processor of clause 16, wherein the processor is configured to: receive the voltage associated with the power switch in the ON state at each cold start associated with the power switch; calculate regression parameters for regression model based on the received voltage at each cold start; and determine the SOH for the power switch at each cold start.

Clause 18—The processor of clause 16 or 17, wherein the processor is configured to issue a maintenance alert in response to an SOH metric indicating a potential problem with the power switch.

Clause 19—A method comprising: receiving a voltage associated with a power switch in an ON state; and determining a SOH for the power switch based on the voltage and a regression model associated with the power switch.

In order to perform techniques of this disclosure, in some examples, computer-readable instructions may be executed by one or more processors, such as one or more digital signal processors (DSPs), general purpose microprocessors, application specific integrated circuits (ASICs), field programmable gate arrays (FPGAs), or other equivalent integrated or discrete logic circuitry. Accordingly, the terms "processor" and "processing circuitry," as used herein may refer to any of the foregoing structures or any other structure suitable for implementation of the techniques described herein. In addition, in some aspects, the functionality described herein may be provided within dedicated hardware and/or software modules configured to perform the techniques of this disclosure. Also, the techniques could be fully implemented in one or more circuits or logic elements.

Various systems, devices, circuits, methods, and features have been described in this disclosure. These and other systems, devices, circuits, methods, and features are within the scope of the following claims.

The invention claimed is:

1. An automotive system comprising:
a power module including a power switch comprising a field effect transistor (FET) or an insulated gate bipolar transistor (IGBT) configured to deliver power to a load associated with a vehicle;
a driver circuit configured to control an ON state and an OFF state of the power switch to deliver power to the load associated with the vehicle; and
a processor configured to control the driver circuit, wherein the processor is configured to receive a measured voltage over the power switch in the ON state at a cold start of the vehicle and determine a state of health (SOH) for the power switch based on the measured voltage and a regression model associated with the power switch, wherein the measured voltage over the power switch comprises a measurement of a drain-to source voltage over the FET at the cold start of the vehicle or a collector-to-emitter voltage over the IGBT at the cold start of the vehicle.

2. The system of claim 1, wherein determining the SOH for the power switch comprises determining a SOH metric, and wherein the processor is configured to issue a maintenance alert in response to the SOH metric reaching a remaining useful life threshold.

3. The system of claim 1, wherein to determine the SOH, the processor is configured to identify a wire break event based on the voltage and the regression model, wherein the processor is configured to issue a maintenance alert in response to identifying the wire break event.

4. The system of claim 1, wherein the processor is configured to:
receive the voltage associated with the power switch in the ON state at each cold start of the vehicle;
calculate regression parameters for the regression model based on the received voltage at each cold start of the vehicle; and
determine the SOH for the power switch at each cold start of the vehicle.

5. The system of claim 1, wherein the processor is configured to:
store voltage values associated with the power switch in a memory associated with the processor at each cold start of the vehicle; and
calculate regression parameters for the regression model based at least in part on the stored voltage values.

6. The system of claim 1, wherein the processor is configured to:
receive temperature values associated with the power switch at each cold start of the vehicle;
receive voltage values associated with the power switch at each cold start of the vehicle;
calibrate each of the voltage values associated with the power switch at each cold start of the vehicle based on the received temperature values associated with the power switch at each cold start of the vehicle;
store calibrated voltage values associated with the power switch in a memory associated with the processor for each cold start of the vehicle; and
calculate regression parameters for the regression model based at least in part on the calibrated voltage values.

7. The system of claim 6, wherein the temperature values correspond to a junction temperature of the power switch measured by a temperature sensor integrated in the power module.

8. The system of claim 6, wherein the temperature values correspond to an ambient temperature of the power switch measured by an external temperature sensor that is located on or within a circuit package associated with the power module.

9. The system of claim 1, wherein the processor is configured to:
store voltage values associated with the power switch in a memory associated with the processor at each cold start of the vehicle;
store thermal resistance values associated with the power switch in the memory associated with the processor at each cold start of the vehicle; and
calculate regression parameters for the regression model based at least in part on the stored voltage values and the stored thermal resistance values associated with the power switch.

10. The system of claim 1, wherein the power switch comprises a FET and the voltage associated with the power switch comprises a drain-to-source voltage associated with the FET in the ON state.

11. The system of claim 1, wherein the power switch comprises an IGBT and the voltage associated with the power switch comprises a collector-to-emitter voltage associated with the IGBT in the ON state.

12. The system of claim 1, wherein the driver circuit includes an analog-to-digital converter configured to determine the voltage associated with the power switch.

13. The system of claim 1, wherein the power module includes a high-side power switch and a low side power switch, wherein the processor is configured to determine a SOH metric for the power module based on a first SOH metric for the high-side power switch and a second SOH metric for the low-side power switch.

14. The system of claim 1, wherein the power module includes six power switches arranged in three pairs of high-side and low-side switches, wherein the power module is configured to control a three-phase electric motor, and wherein the processor is configured to determine a SOH metric for the power module based on six different SOH metrics for the six power switches.

15. A processor associated with a power switch comprising a field effect transistor (FET) or an insulated gate bipolar transistor (IGBT) configured to deliver power to a load associated with a vehicle, wherein the processor is configured to control a driver circuit for the power switch to deliver power to the load associated with the vehicle and wherein the processor comprises circuitry configured to:
receive a measured voltage over the power switch in an ON state at a cold start of the vehicle and determine a state of health (SOH) for the power switch based on the voltage and a regression model associated with the power switch, wherein the measured voltage over the power switch comprises a measurement of a drain-to source voltage over the FET at the cold start of the vehicle or a collector-to-emitter voltage over the IGBT at the cold start of the vehicle.

16. The processor of claim 15, wherein the processor is configured to:
receive the voltage associated with the power switch in the ON state at each cold start of the vehicle;

calculate regression parameters for the regression model based on the received voltage at each cold start of the vehicle; and determine the SOH for the power switch at each cold start of the vehicle.

17. The processor of claim 16, wherein the processor is configured to issue a maintenance alert in response to an SOH metric indicating a potential problem with the power switch.

18. A method comprising:

receiving a measured voltage associated with a power switch in an ON state at a cold start of a vehicle, wherein the power switch comprises a field effect transistor (FET) or an insulated gate bipolar transistor (IGBT) configured to deliver power to a load associated with a vehicle; and determining a state of health (SOH) for the power switch based on the measured voltage and a regression model associated with the power switch, wherein the measured voltage over the power switch comprises a measurement of a drain-to source voltage over the FET at the cold start of the vehicle or a collector-to-emitter voltage over the IGBT at the cold start of the vehicle.

* * * * *